(12) United States Patent
Wu

(10) Patent No.: US 7,572,707 B2
(45) Date of Patent: Aug. 11, 2009

(54) METHOD OF MANUFACTURING NPN DEVICE

(75) Inventor: Schyi-yi Wu, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 9 days.

(21) Appl. No.: 11/754,234

(22) Filed: May 25, 2007

(65) Prior Publication Data

US 2008/0290464 A1    Nov. 27, 2008

(51) Int. Cl.
*H01L 21/331* (2006.01)
(52) U.S. Cl. ............... 438/335; 438/357; 257/E21.373
(58) Field of Classification Search .......... 435/335, 435/357, FOR. 166; 257/E21.373; 438/335, 438/357, FOR. 166
See application file for complete search history.

(56) References Cited

U.S. PATENT DOCUMENTS

| 4,512,816 | A | * | 4/1985 | Ramde et al. ............... 438/357 |
| 4,979,008 | A | * | 12/1990 | Siligoni et al. ............. 257/547 |
| 5,648,281 | A | * | 7/1997 | Williams et al. ............ 438/358 |
| 6,815,800 | B2 | * | 11/2004 | Mallikarjunaswamy ..... 257/565 |
| 2005/0029582 | A1 | * | 2/2005 | Mallikarjunaswamy ..... 257/328 |

* cited by examiner

*Primary Examiner*—George Fourson
(74) *Attorney, Agent, or Firm*—Sawyer Law Group P.C.

(57) ABSTRACT

A method of forming a semiconductor device is disclosed. The method includes providing a floor for a semiconductor device by utilizing a CMOS process. The method further includes providing a BiCMOS-like process on top of the floor to further fabricate the semiconductor device, wherein the BiCMOS-like process and the CMOS process provides the semiconductor device.

6 Claims, 6 Drawing Sheets

METHOD OF MANUFACTURING NPN DEVICE

FIELD OF INVENTION

The present invention relates generally to integrated circuits, and in particular to a method for manufacturing an NPN device.

BACKGROUND OF THE INVENTION

FIG. 1 shows a NPN device 100 formed by a traditional Complementary Metal Oxide Semiconductor (CMOS) process. The NPN device 100 includes a P− epitaxial layer 102 over a p-type substrate 104. The NPN device 100 further includes N+ type source and drain implants that function as an emitter, a Pbase implant that functions as a base, and a N-well that functions as a collector. The NPN device 100 is isolated by a P-well ring 106 and an optional P+ buried layer (ISOUP) 108 at the bottom of the device, as shown in FIG. 1. Typically, producing NPN devices by a traditional CMOS process is simpler and cheaper than fabricating these devices in other platforms. However, NPN devices produced by the traditional CMOS process may not provide the maximum performance of NPN devices produced in bipolar platforms. Furthermore, in CMOS platforms, an N-well is optimized for P-channel performance and a NPN collector is formed with an N-well. As such, the N-well constrains a NPN beta and breakdown voltage within an NPN device.

To improve performance, NPN devices have been constructed within a Bipolar Complementary Metal Oxide Semiconductor (BiCMOS) platform. For example, FIG. 2 shows a NPN device 200 formed by a conventional BiCMOS process. The NPN device 200 includes a N− epitaxial layer 202 over a p-type substrate 208. The NPN device 200 further includes an implanted N+ buried layer 204, an implanted P+ buried layer (ISOUP) 206, and an implanted P-well 210 that functions as an isolation ring. Typically, the implanted N+ buried layer and P+ buried layers are formed utilizing two separate masking steps to achieve selective implanting within a semiconductor substrate. Furthermore, NPN devices formed within a BiCMOS platform may use a N−epitaxial layer of proper thickness and doping concentration, to obtain a desired beta and breakdown voltage trade-off. As such, although utilizing a conventional BiCMOS platform provides a higher performing NPN device, the process also involves additional processing which leads to an increase in manufacturing costs.

Thus, what is needed is a system and method that addresses the above-identified issues. The present invention addresses such a need.

SUMMARY OF THE INVENTION

A method of forming a semiconductor device is disclosed. The method includes providing a floor for a semiconductor device by utilizing a CMOS process. The method further includes providing a BiCMOS-like process on top of the floor to further fabricate the semiconductor device, wherein the BiCMOS-like process and the CMOS process provides the semiconductor device.

DETAILED DESCRIPTION OF THE INVENTION

The present invention relates generally to integrated circuits, and in particular to a method for manufacturing an NPN device. The following description is presented to enable one having ordinary skill in the art to make and use the embodiment and is provided in the context of a patent application and the generic principles and features described herein will be apparent to those skilled in the art. Thus, the present embodiment is not intended to be limited to the embodiments shown, but is to be accorded the widest scope consistent with the principles and features described herein.

A system and method of the present invention provides a hybrid CMOS/BiCMOS-like process to form a CMOS floor within a BiCMOS platform to form a NPN device. The floor of the NPN device may include a substrate with a plurality of implant layers or a blanket implant layer on a top portion of the substrate. A BiCMOS-like process may be utilized to complete the formation of the device on top of the floor. Accordingly, the process takes advantage of a low manufacturing cost technique (CMOS processing) to produce a NPN device within a high-performance BiCMOS platform.

Figure 3:
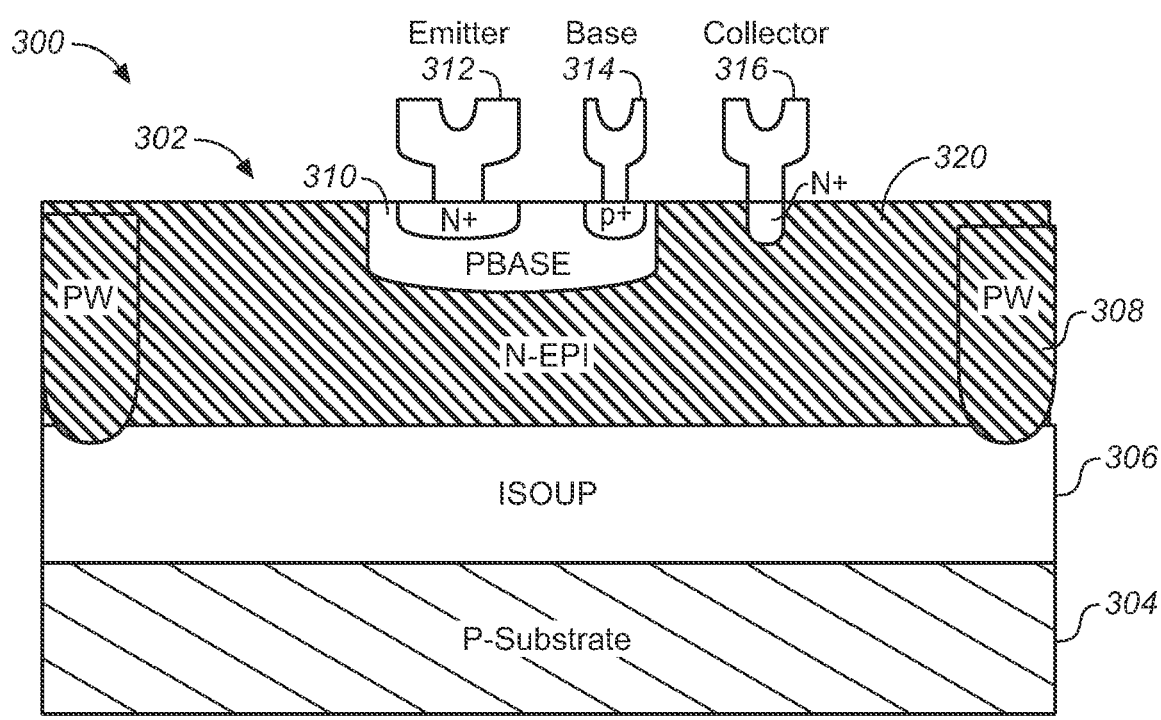
FIG. 3 shows a NPN device having a CMOS floor within a BiCMOS platform, in accordance with the present invention.

FIG. 3 shows a NPN device 300 having a CMOS floor within a BiCMOS platform, in accordance with the present invention. As shown, the NPN device 300 includes a P− substrate 304 and a single, continuous P+ buried layer (ISOUP) 306 thereon (on and over the P− substrate 304). In an embodiment, the P− substrate 304 and the P+ buried layer (ISOUP) 306 are within the CMOS floor of NPN device 300. Additionally, FIG. 3 shows that the N− epitaxial layer 302 is disposed upon the P+ buried layer (ISOUP) 306.

The NPN device 300 further includes structures formed by a BiCMOS process such as P-wells 308 disposed within the N− epitaxial layer 302 (N− epitaxial layer 302 is also formed by the BiCMOS process). As shown, the P-wells 308 extend into the P+ buried layer (ISOUP) 306 to provide an electrical path from a surface of silicon through P-wells 308, P+ buried layer (ISOUP) 306, and into P−substrate 304, which provides desirable isolation and grounding. In an embodiment, the electrical conductive path is of P-type conductivity. Thus, the P-wells 308 extend a p-type electrical path through the N− epitaxial layer 302 to the P+ buried layer 306.

The NPN device 300 also includes additional features formed by the BiCMOS-like process such as a p-type base region 310 disposed within a top portion of the N− epitaxial layer 302. An emitter terminal 312 and a base terminal 314 are located on top of the p-type base region 310. Adjacent to the base terminal 314 is a collector terminal 316 that extends from the surface of the N− epitaxial layer 302.

Accordingly, the NPN device 300 features a CMOS floor (P− substrate 304 and P+ buried layer 306) disposed below a plurality of structures formed by a BiCMOS-like process, all within a BiCMOS platform.

Features within the NPN 300 described above provide isolation for the device and allow contact to the substrate and ground. Specifically, the P+ buried layer (ISOUP) isolates the bottom of the NPN device 300. The P-wells 308 form an isolation ring around the NPN device 300 and allow contact to the P− substrate 304 and ground. That is, the P+ buried layer (ISOUP) 306 and the P-wells 308 collectively isolates the NPN device 300 around the sides and bottom of the device 300.

Figure 4:
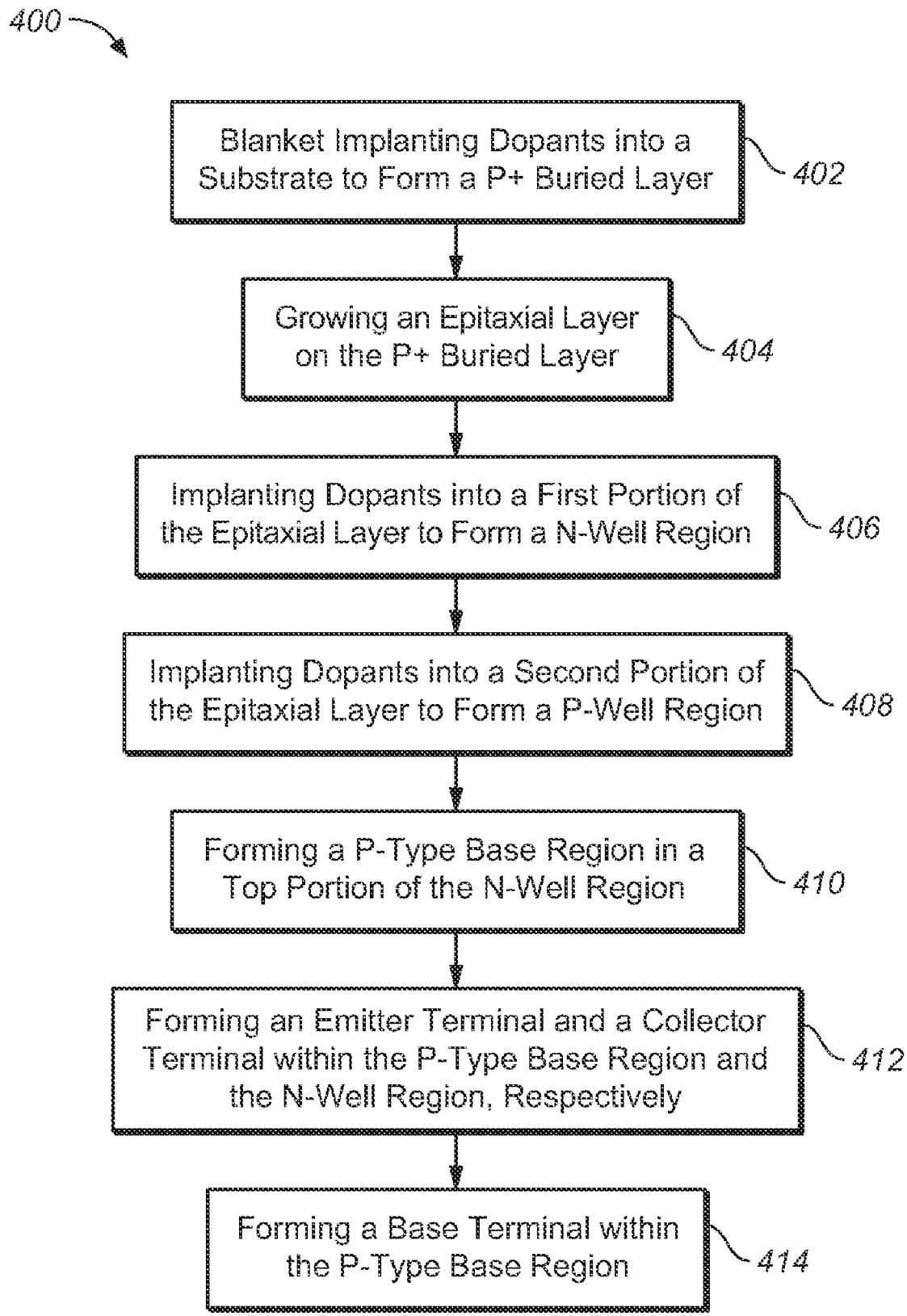
FIG. 4 shows a flowchart of a method for forming the NPN device, in accordance with the present invention.

An NPN device may be formed by a hybrid CMOS/BiCMOS (or BiCMOS-like) process that features two less masking steps than a conventional BiCMOS process. FIG. 4 shows a flowchart 400 for forming the NPN device and FIGS. 5-11 illustrate the device formation at each major step of the process for forming the NPN device.

Figure 1:
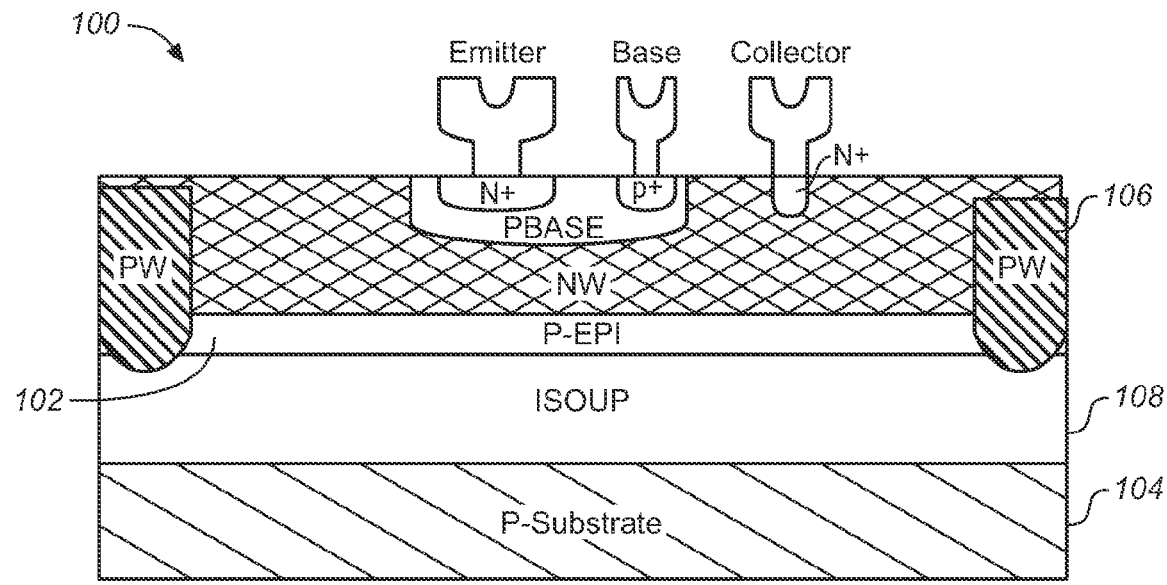
FIG. 1 shows a NPN device formed by a conventional CMOS platform.
Figure 2:
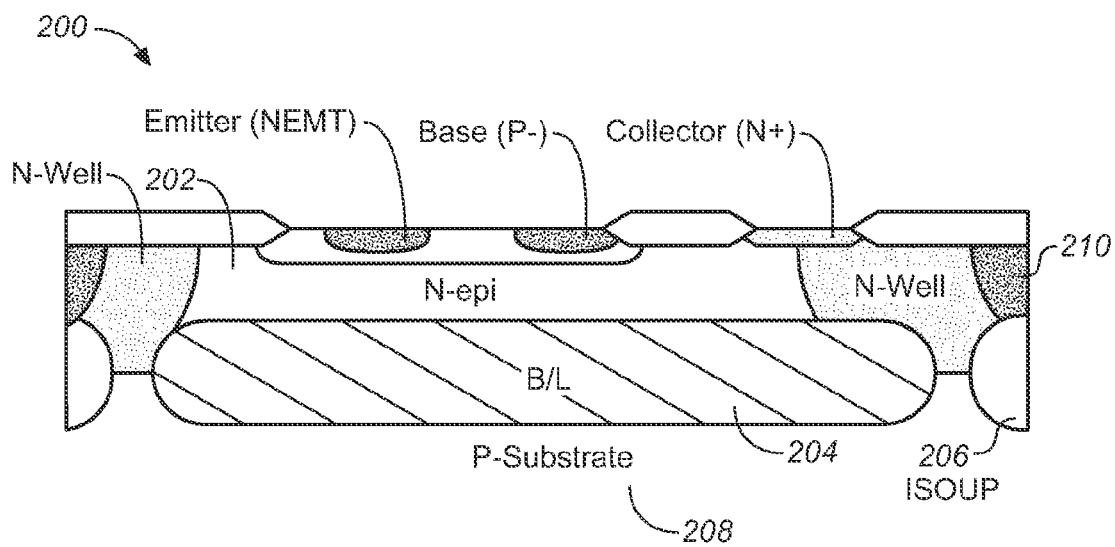
FIG. 2 shows a NPN device formed by a conventional BiCMOS platform.
Figure 5:
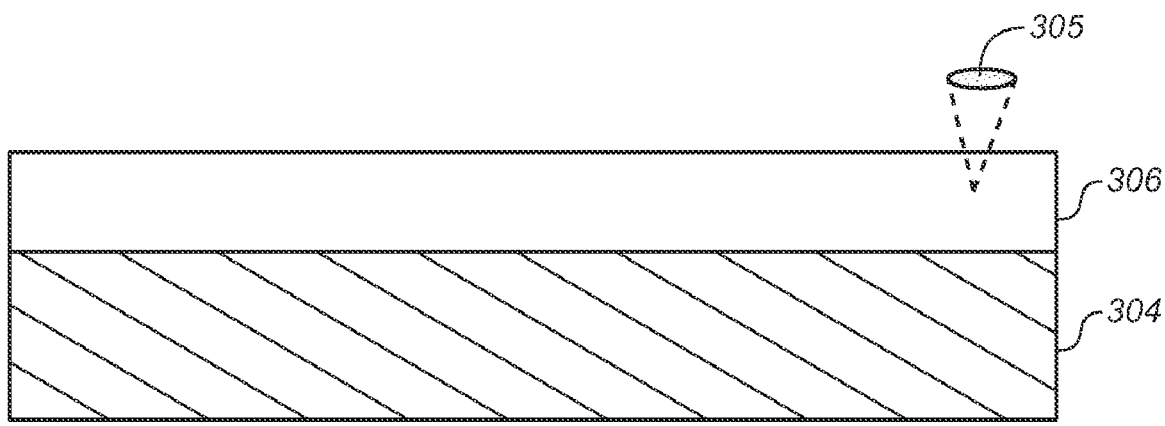
FIGS. 5-11 illustrate the device formation at each major step of the process for forming the NPN device.

Referring to FIGS. 3-11, the process for forming the NPN device 300 begins, via step 402, by blanket implanting a plurality of p-type dopants 305 into the P− substrate 304 to form the single, continuous P+ buried layer 306, as shown in FIG. 5. Additionally, the NPN device 300 includes only one buried layer, P+ buried layer 306, instead of two buried layers (such as N+ buried layer 204 and P+ buried layer 206 shown within the NPN device of FIG. 2). Thus, the blanket implanting technique removes the need of two masking steps that would be required in conventional BiCMOS processes.

The p-type dopants 305 may be implanted to any depth within the P−substrate 304 such that the P+ buried layer 306 extends as far within the P-type substrate 304 as desired. In an embodiment, the p-type dopants 305 are implanted such that the P+ buried layer 306 extends 2.5 microns into P-type substrate 304.

Figure 6:
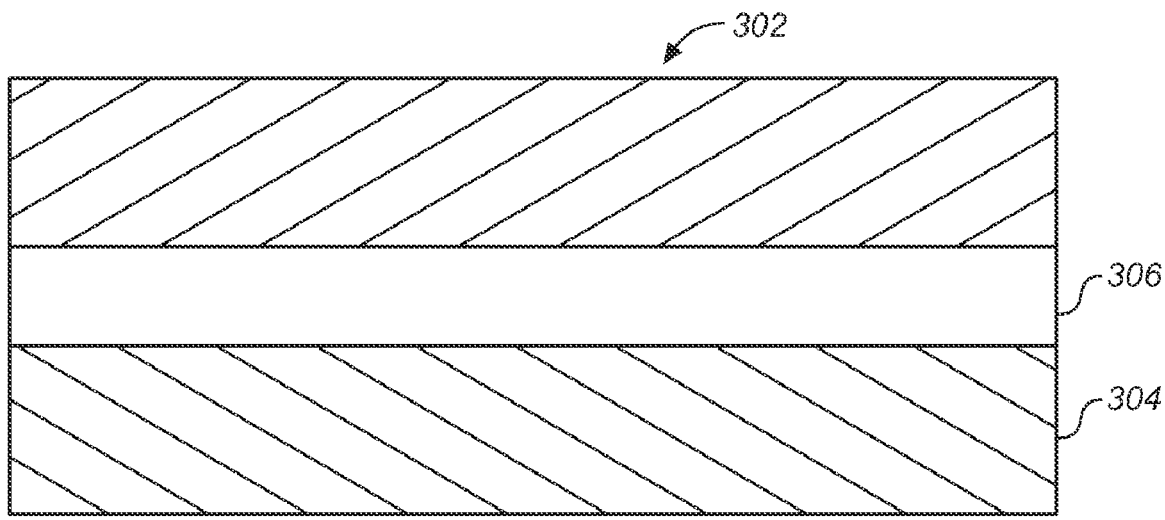

Next, via step 404, the N− epitaxial layer 302 is grown on the P+ buried layer 306, as shown in FIG. 6. In an embodiment, the N− epitaxial layer 302 is lightly doped to provide a high breakdown voltage. For example, N− epitaxial layer 302 is doped to $1 \times 10^{16}$ atoms/cm$^3$ and provides a lowest sustainable breakdown voltage (LVCEO) of 10V.

Figure 7:
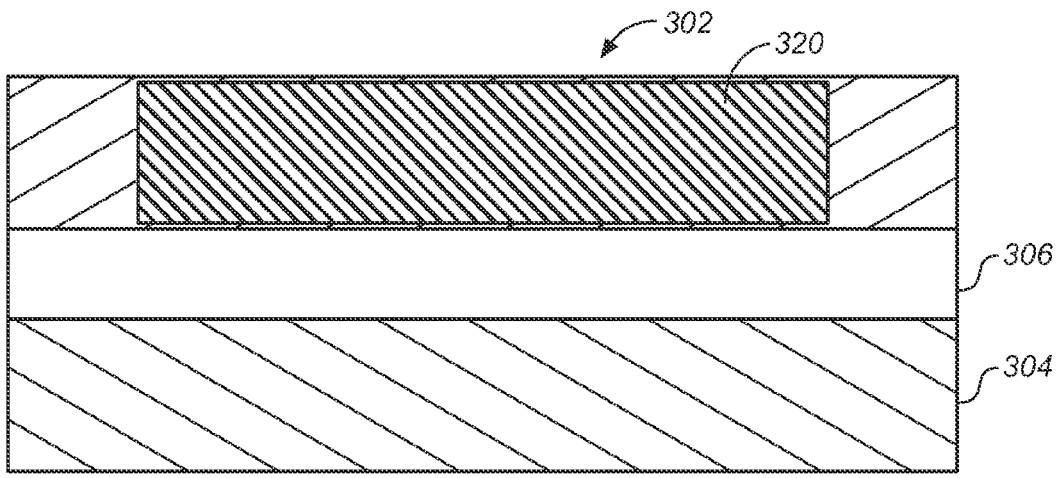

After the N− epitaxial layer 302 is grown, dopants are implanted into a first portion of the epitaxial layer to form an n-well region 320, via step 406 as shown in FIG. 7.

Figure 8:
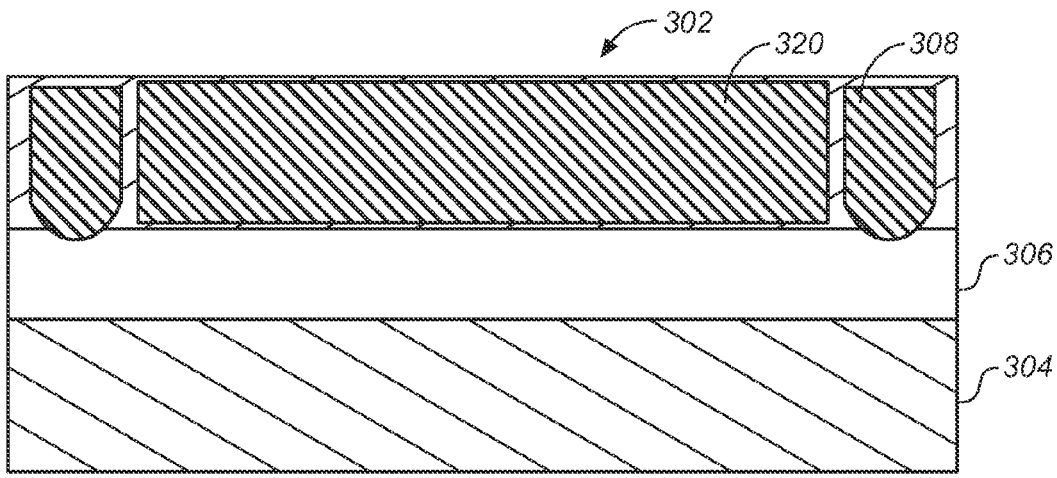

Next, the P-well regions 308 are formed within a second portion of the N− epitaxial layer 302, via step 408, as shown in FIG. 8. In an embodiment, the P-well regions 308 extend into a top portion of the P+ buried layer 306 as shown in FIG. 8.

Figure 9:
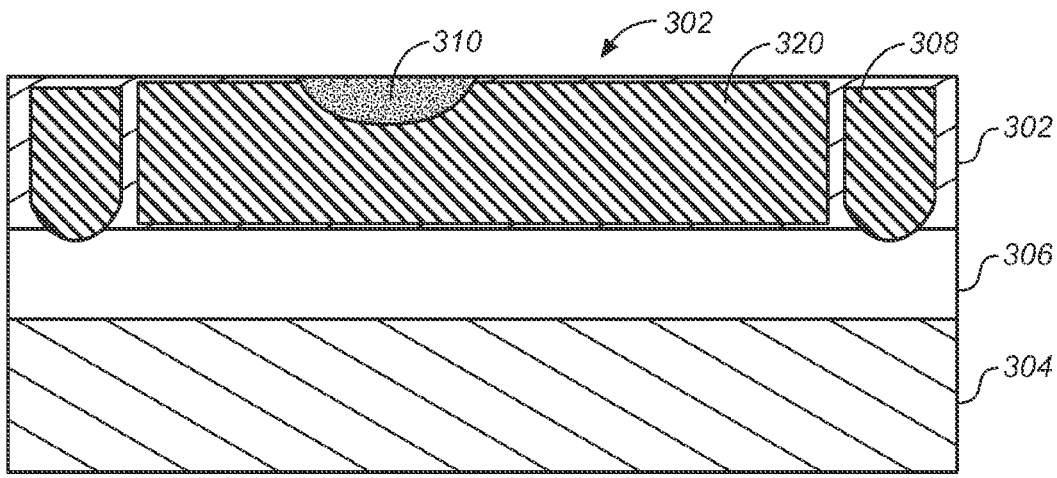
Figure 10:
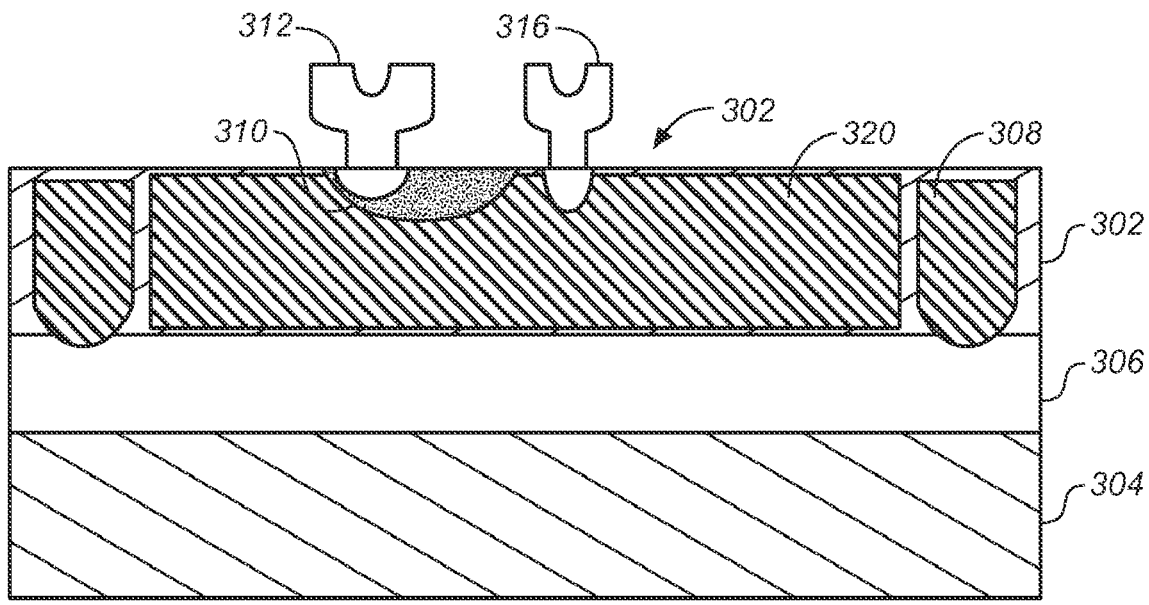
Figure 11:
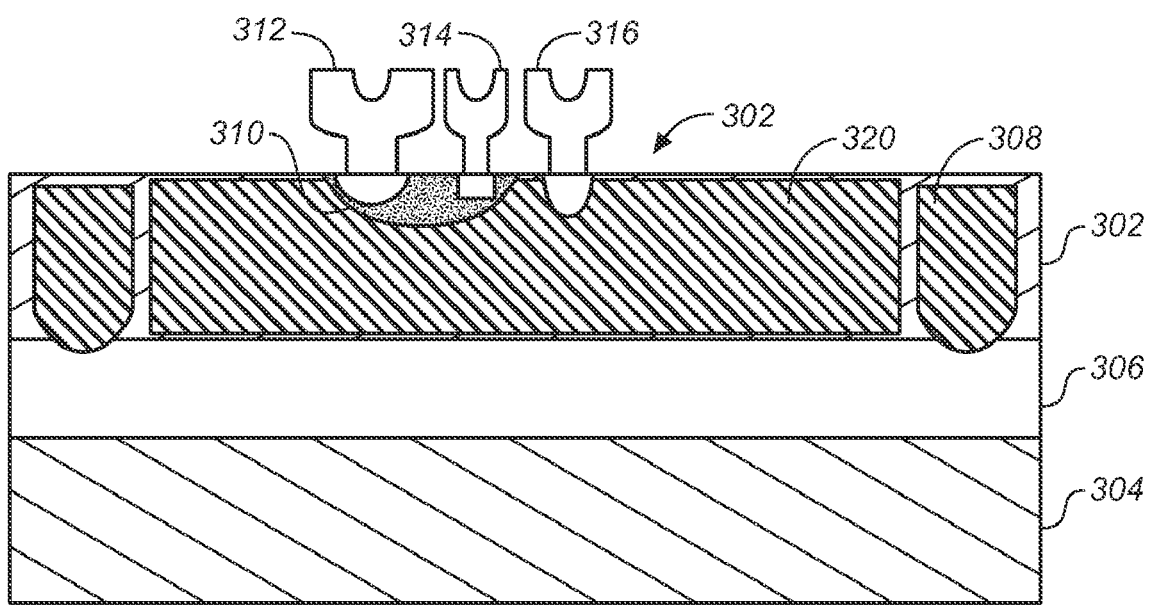

The process continues via step 410 by implanting dopants into a third portion of the N− epitaxial layer 302 to form the p-type base region 310 in a top portion of the N− epitaxial layer 302, as shown in FIG. 9. Once the p-type base region 310 is formed, an emitter terminal 312 and a collector terminal 316 are formed on top of the p-type base region 310 and N-well region 320 respectively, via step 412, as shown in FIG. 10. Next, as shown in FIG. 11, a base terminal is formed within the p-type base region 310 between the emitter terminal 312 and the collector terminal 316, via step 414.

A system and method in accordance with the present invention eliminates the need of two masking steps, N+ and P+ buried layer masking steps of the conventional BiCMOS process. By eliminating these two masking steps, a high performance NPN device can be formed with shorter processing cycle times and a lower manufacturing cost per die.

Additionally, a CMOS-designed device can be produced by a BiCMOS-like process without a need to re-design the device. Furthermore, a CMOS-designed device produced by a BiCMOS-like process share similar electrical characteristics as devices produced by a conventional BiCMOS process (such as the device 200 in FIG. 2).

Accordingly, the NPN device 300 takes advantage of traditional CMOS processing to form a simple CMOS floor within a high performance BiCMOS platform. As such, the NPN device 300 is manufactured with minimal cost and features high performance device structures.

Although the present embodiment has been described in accordance with the embodiments shown, one having ordinary skill in the art will readily recognize that there could be variations to the embodiments and those variations would be within the spirit and scope of the present embodiment. Accordingly, many modifications may be made by one having ordinary skill in the art without departing from the spirit and scope of the appended claims.

What is claimed is:

1. A method of forming a semiconductor device comprising:
    blanket implanting a first plurality of dopants into a substrate to form a buried
    layer, wherein a masking step is not utilized to form the buried layer;
    growing an epitaxial layer on the buried layer;
    implanting a second plurality of dopants into a first portion of the epitaxial layer to form a first well region within the epitaxial layer;
    implanting a third plurality of dopants into a second portion of the epitaxial layer to form a second well adjacent to the first well within the epitaxial layer;
    forming a base region in a top portion of the first well region;
    forming an emitter terminal within the base region and a collector terminal within the first well region adjacent to the base region; and
    forming a base terminal within the base region and adjacent to the emitter terminal,
    wherein the first plurality of dopants include a plurality of p-type dopants, the second plurality of dopants include a plurality of n-type dopants,
    and the third plurality of dopants include a plurality of p-type dopants.

2. A method of forming a semiconductor device comprising:
    blanket implanting a first plurality of dopants into a substrate to form a buried
    layer, wherein a masking step is not utilized to form the buried layer;
    growing an epitaxial layer on the buried layer;
    implanting a second plurality of dopants into a first portion of the epitaxial layer to form a first well region within the epitaxial layer;
    implanting a third plurality of dopants into a second portion of the epitaxial layer to form a second well adjacent to the first well within the epitaxial layer;
    forming a base region in a tor portion of the first well region;
    forming an emitter terminal within the base region and a collector terminal within the first well region adjacent to the base region; and
    forming a base terminal within the base region and adjacent to the emitter terminal,
    wherein the base region is a p-type base region.

3. A method of forming a semiconductor device comprising:
    blanket implanting a first plurality of dopants into a substrate to form a buried
    layer, wherein a masking strep is not utilized to form the buried layer;
    growing an epitaxial layer on the buried layer;
    implanting a second plurality of dopants into a first portion of the epitaxial layer to form a first well region within the epitaxial layer;

implanting a third plurality of dopants into a second portion of the epitaxial layer to form a second well adjacent to the first well within the epitaxial layer;

forming a base region in a tor portion of the first well region;

forming an emitter terminal within the base region and a collector terminal within the first well region adjacent to the base region; and forming a base terminal within the base region and adjacent to the emitter terminal, wherein the semiconductor device is a NPN device.

4. A method of forming a NPN device comprising:

blanket implanting a plurality of p-type dopants into a p-type substrate to form a P+ buried layer, wherein a masking step is not utilized to form the P+ buried layer;

growing an epitaxial layer on the P+ buried layer;

implanting a plurality of n-type dopants into a first portion of the epitaxial layer to form a n-well region within the epitaxial layer;

implanting a plurality of p-type dopants into a second portion of the epitaxial layer adjacent to the n-well to form a p-well region within the epitaxial layer;

forming a p-type base region in a top portion n-well region;

forming an emitter terminal within the p-type base region and a collector terminal within the n-well adjacent to the base; and forming a base terminal within the p-type base region and adjacent to the emitter terminal.

5. The method of claim 4, wherein the P+ buried layer extends 2.5 microns into the p-type substrate.

6. The method of claim 4, wherein the concentration of n-type dopants in the N− epitaxial layer is approximately $1 \times 10^{16}$ atoms/cm$^3$.

* * * * *